US005844416A

United States Patent [19]
Campbell et al.

[11] Patent Number: 5,844,416
[45] Date of Patent: Dec. 1, 1998

[54] ION-BEAM APPARATUS AND METHOD FOR ANALYZING AND CONTROLLING INTEGRATED CIRCUITS

[75] Inventors: Ann N. Campbell, Albuquerque; Jerry M. Soden, Placitas, both of N. Mex.

[73] Assignee: Sandia Corporation, Albuquerque, N. Mex.

[21] Appl. No.: 552,184

[22] Filed: Nov. 2, 1995

[51] Int. Cl.$^6$ .................................................. G01R 31/302
[52] U.S. Cl. ........................................................ 324/750
[58] Field of Search .................................... 324/750, 751; 250/309, 396; 204/192

[56] References Cited

U.S. PATENT DOCUMENTS

| | | | |
|---|---|---|---|
| 4,639,301 | 1/1987 | Doherty et al. | 204/192.31 |
| 4,818,872 | 4/1989 | Parker | 250/309 |
| 4,843,330 | 6/1989 | Golladay et al. | 324/751 |
| 4,851,097 | 7/1989 | Hattori et al. | 204/192.33 |
| 4,875,971 | 10/1989 | Orbach | 156/644 |
| 4,912,327 | 3/1990 | Waugh | 250/309 |
| 4,924,287 | 5/1990 | Orbach | 257/204 |
| 4,943,769 | 7/1990 | Golladay et al. | 324/750 |
| 4,954,773 | 9/1990 | Brust | 324/751 |
| 4,996,659 | 2/1991 | Yamaguchi et al. | 364/579 |
| 5,057,773 | 10/1991 | Golladay et al. | 324/750 |
| 5,089,774 | 2/1992 | Nakano | 324/750 |
| 5,140,164 | 8/1992 | Talbot | 250/492.2 |
| 5,155,368 | 10/1992 | Edwards, Jr. et al. | 250/396 |
| 5,376,883 | 12/1994 | Kaito | 324/158.1 |
| 5,430,305 | 7/1995 | Cole | 250/559.07 |
| 5,521,517 | 5/1996 | Shida et al. | 324/751 |
| 5,525,806 | 6/1996 | Iwasaki et al. | 250/492.21 |

OTHER PUBLICATIONS

J. R. Haberer and J. J. Bart, "Charge Induced Instability in 709 Operational Amplifiers," *Proceedings of the International Reliability Physics Symposium* [IEEE], pp. 106–111, 1972. (month unavailable).

D. E. Sawyer and D. W. Berning, "Laser Scanning of MOS IC's Reveals Internal Logic States Nondestructively," *Proceedings of the IEEE*, vol. 64, pp. 393–394, Mar. 1976.

N. Benazeth, "Review on Kinetic Ion–Electron Emission from Solid Metallic Targets," *Nuclear Instruments and Methods*, vol. 194, pp. 405–413, 1982. (month unavailable).

H. T. Lin, J. F. McDonald, J. C. Corelli, S. Balakrishnan, and N. King, "Focused Electron and Ion Beam Repair Strategies for Wafer–Scale Interconnections in Thin Film Packaging," *Thin Solid Films*, vol. 166, pp. 121–130, 1988. (month unavailable).

H. Ogawa, K. Tamura, K. Matsuyama, M. Fukumoto, and H. Iwasaki, "Application of FIB for In–Process Mapping of Failed Capacitors of High–Mega–Bit DRAM," *Extended Abstracts of the 22nd Conference on Solid State Devices and Materials*, pp. 405–408, 1990. (month unavailable).

(List continued on next page.)

*Primary Examiner*—Ernest F. Karlsen
*Assistant Examiner*—Anh Phung
*Attorney, Agent, or Firm*—John P. Hohimer

[57] ABSTRACT

An ion-beam apparatus and method for analyzing and controlling integrated circuits. The ion-beam apparatus comprises a stage for holding one or more integrated circuits (ICs); a source means for producing a focused ion beam; and a beam-directing means for directing the focused ion beam to irradiate a predetermined portion of the IC for sufficient time to provide an ion-beam-generated electrical input signal to a predetermined element of the IC. The apparatus and method have applications to failure analysis and developmental analysis of ICs and permit an alteration, control, or programming of logic states or device parameters within the IC either separate from or in combination with applied electrical stimulus to the IC for analysis thereof. Preferred embodiments of the present invention including a secondary particle detector and an electron floodgun further permit imaging of the IC by secondary ions or electrons, and allow at least a partial removal or erasure of the ion-beam-generated electrical input signal.

33 Claims, 3 Drawing Sheets

OTHER PUBLICATIONS

A. N. Campbell, E. I. Cole, Jr., C. L. Henderson, and M. R. Taylor, "Case History: Failure Analysis of a CMOS SRAM with an Intermittent Open Contact," *Proceedings of the 17th International Symposium for Testing and Failure Analysis,* pp. 261–269, Nov. 11, 1991.

J. M. Soden and R. E. Anderson, "IC Failure Analysis: Techniques and Tools for Quality and Reliability Improvement," *Proceedings of the IEEE,* vol. 81, pp. 703–715, May 1993.

E. I. Cole, Jr., J. M. Soden, J. L. Rife, D. L. Barton, and C. L. Henderson, "Novel Failure Analysis Techniques Using Photon Probing With a Scanning Optical Microscope," *32nd Annual Proceedings Reliability Physics 1994,* pp. 388–398, Apr. 12, 1994.

D. Perrin and W. Seifert, "Rapid Prototyping of Submicron ICs Using FIB," *Solid State Technology,* pp. 95–96, Oct. 1994.

F. A. Stevie, T. C. Shane, P. M. Kahora, R. Hull, D. Bahnck, V. C. Kannan, and E. David, "Applications of Focused Ion Beams in Microelectronics Production, Design, and Development," *Surface and Interface Analysis,* vol. 3, pp. 61–68, 1995. (month unavailable).

ION-BEAM APPARATUS AND METHOD FOR ANALYZING AND CONTROLLING INTEGRATED CIRCUITS

This invention was made with Government support under Contract No. DE-AC0494AL85000 awarded by the U.S. Department of Energy. The Government has certain rights in the invention.

FIELD OF THE INVENTION

The present invention relates generally to apparatus and methods for the analysis and/or control of semiconductor integrated circuits (ICs), and specifically to a focused-ion-beam apparatus and method for providing an ion-beam-generated electrical input signal to one or more predetermined portions of an IC for analyzing and/or controlling the IC (e.g. failure analysis or developmental analysis), or for defining at least in part one or more device parameters therein.

BACKGROUND OF THE INVENTION

In the prior art, many different IC analysis methods have been developed as disclosed, for example, in an article by J. M. Soden and R. E. Anderson entitled "IC Failure Analysis: Techniques and Tools for Quality and Reliability Improvement" published in the *Proceedings of the IEEE*, May 1993, pages 703–715. The majority of these prior-art methods allow imaging of selected portions of an IC for localizing defects or for determining logic states, but without any alteration or control of device parameters or logic states within the device.

A more recent IC analysis method termed light-induced voltage alteration (LIVA) is disclosed in U.S. Pat. No. 5,430,305 to E. I. Cole, Jr. et al., and is incorporated herein by reference. The LIVA method uses a beam of light from a lamp or laser for irradiating a predetermined portion of an IC for localizing defects or imaging logic states of the IC. Additionally, the beam of light according to the LIVA method may be used to alter or change a logic state of a transistor within the IC. Use of the LIVA method is based on electron-hole pair generation by light (i.e. photogeneration) within a semiconductor portion of the IC, thereby producing an electrical current that may be used for logic state control or switching. The LIVA method requires optical access to the semiconductor portion, thereby limiting use of the LIVA method to transmissive regions of the IC and preventing direct photogeneration of electron-hole pairs in opaque non-semiconductor regions (e.g. metal conductors). For some analysis applications, such opaque non-semiconductor regions may further limit use of the LIVA method by partially or entirely obscuring an element whose logic state is to be altered or switched.

An advantage of the ion-beam apparatus and method of the present invention is that an IC may be analyzed and a logic state or device parameter therein may be altered or controlled by depositing an ion-beam-generated electrical charge within or proximate to an element of the IC (e.g. a logic or memory cell, or a portion thereof), including depositing the charge on a substantially opaque layer such as a metal conductor or the like.

A further advantage of the ion-beam apparatus and method of the present invention is that a focused ion beam may be used to remove, at least in part, a material layer overlying the predetermined portion of the IC prior to using that same focused ion beam at a reduced beam current to deposit an electrical charge within the predetermined portion for providing an electrical input thereto or altering a logic state or device parameter therein.

Yet another advantage of the present invention is that the focused ion beam may be used for circuit modifications to the IC (e.g. deposition or removal of one or more material layers including a severing and/or a reconnection of one or more electrical conductors), cross-sectioning of selected elements therein, and imaging of logic states and voltage levels therein before, after or during use of the same ion beam for analyzing the IC by providing one or more electrical inputs thereto or altering one or more logic states or device parameters within the IC.

Still another advantage of the present invention is that one or more device parameters of elements of an IC may be defined, at least in part, by an ion-beam-generated electrical input signal to one or more predetermined portions of the IC for programming, controlling, altering or otherwise affecting operation of the IC.

A further advantage of the present invention is that an ion beam may be focused to a size smaller than a wavelength of an infrared optical beam, thereby allowing use of the present invention to analyze and control elements of ICs having sub-micron feature sizes.

These and other advantages of the ion-beam apparatus and method of the present invention will become evident to those skilled in the art.

SUMMARY OF THE INVENTION

Accordingly, it is a primary object of the present invention to provide an apparatus and method for analyzing and/or controlling an IC by providing an ion-beam-generated electrical input signal to a predetermined portion of the IC.

An additional object of the present invention is to provide an ion-beam apparatus and method for analyzing an IC by controlling, altering or programming one or more logic states or device parameters within a predetermined portion of the IC.

Another object of the present invention is to provide an ion-beam apparatus and method for analyzing and/or controlling an IC by defining, at least in part, one or more device parameters therein by an ion-beam-generated electrical input signal provided to a predetermined portion of the IC.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, an ion-beam apparatus and method for analyzing and/or controlling one or more semiconductor integrated circuits is provided which includes a stage for holding at least one integrated circuit and making a plurality of electrical connections thereto; a source means for producing a focused ion beam; and beam-directing means for directing the focused ion beam to irradiate a predetermined portion of the integrated circuit for sufficient time to provide an ion-beam-generated electrical input signal to one or more predetermined elements of the integrated circuit. The ion-beam-generated electrical input signal may be used to program one or more logic states, device parameters or electrical circuit parameters within the integrated circuit, or to alter at least one preprogrammed logic state, device parameter or circuit parameter therein. The ion-beam apparatus and method may further include detection means for detecting an electrical effect in the integrated circuit due to the electrical input signal for analysis of the integrated circuit.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating a preferred embodiment of the invention and are not to be construed as limiting the invention. In the drawings.

DETAILED DESCRIPTION OF THE INVENTION

Figure 1:
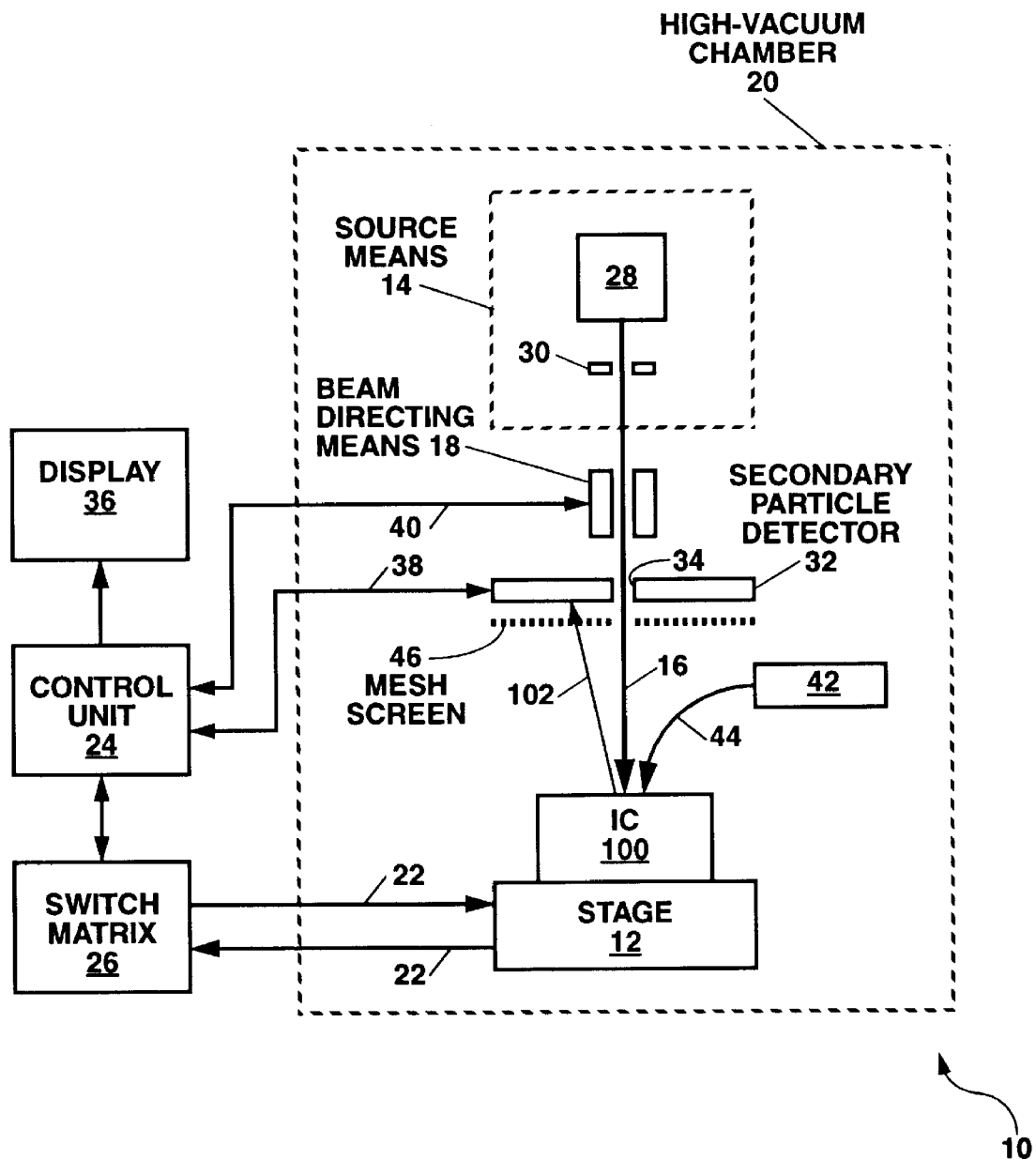
FIG. 1 shows a schematic representation of the ion-beam apparatus of the present invention.

Referring to FIG. 1, there is shown a schematic representation of the ion-beam apparatus 10 of the present invention. The apparatus 10 comprises a stage 12 for holding at least one integrated circuit (IC) 100 and making a plurality of electrical connections thereto; a source means 14 for generating a focused ion beam 16; and a beam-directing means 18 for directing the focused ion beam to irradiate a predetermined portion of the IC 100 for a period of time sufficient to produce an ion-beam-generated electrical input signal therein. The apparatus 10 may further include detection means for detecting an electrical effect produced within the IC by the ion-beam-generated electrical input signal. Furthermore, a high-vacuum chamber 20 (including pump means for creating a vacuum therein) is preferably provided for containing one or more ICs 100 and elements of the source means and the beam-directing means. The chamber 20 may further include a load-lock or the like for providing for a rapid insertion and removal of the ICs for providing a high throughput for the analysis and/or control of many ICs.

In FIG. 1, the stage 12 holds one or more ICs to be analyzed. The ICs 100 may be in any form known to the art, including a wafer form comprising a plurality of ICs on a semiconductor wafer; a die form comprising a single IC removed from a wafer for later mounting in a package, module, or the like; and a packaged form comprising one or more die affixed to a carrier or heatsink. In using the present invention for the analysis of packaged ICs, a surface of the IC die generally must be exposed to the focused ion beam; and this may require removal of a package lid and one or more passivation layers by methods known to the art.

A plurality of electrical connections 22 may be made to the IC 100 for connection of the IC to electrical means for activating or powering the IC, and for measuring the electrical effect produced in the IC by the focused-ion-beam irradiation. The electrical connections may include one or more sockets, probes, clips or the like that are configured or moveable for connection to contact pads or probe points on the IC 100. The electrical connections 22 may further penetrate the high-vacuum chamber 20 (e.g. by one or more electrical feedthroughs) for connection to electrical means outside the chamber 20, with the electrical means preferably comprising a control unit 24 (e.g. a power supply, computer, parameter analyzer or the like) that is preferably routed through a switch matrix 26 (e.g. a digital tester) for powering the IC 100 and providing electrical signals to and/or from the IC for activation thereof (e.g. providing electrical stimulus or logic inputs to the IC), and for measuring the ion-beam-generated electrical effect (e.g. an electrical signal, logic state or device parameter within the IC that is determined at least in part by the focused-ion-beam irradiation). In some embodiments of the invention, the ion-beam apparatus may be used to provide an electrical input signal to an IC (e.g. to alter or program one or more logic states or device parameters in the IC), with the electrical means being located apart from (i.e. disconnected from) the ion-beam apparatus 10 for a subsequent detection or measurement of the electrical effect in the IC due to the ion-beam-generated electrical input signal.

In FIG. 1, the source means 14 comprises a liquid metal ion source 28 that provides a beam of metal ions (e.g. $Ga^+$) directed outward from the source and having an ion energy in the range of about 10–50 kV, and preferably about 30 kV. The current of the ion beam is preferably controllable in the range from a few pA to a few nA (e.g. by a beam-limiting aperture of a predetermined size placed into the path of the ion beam). A low ion-beam current in the pA range is generally to be preferred for analyzing the IC 100 so that any sputtering of the surface of the IC is minimized and the possibility for permanent physical damage to the IC is reduced; whereas a high ion-beam current may be preferred for prior or subsequent process steps wherein material is to be removed or deposited upon the surface of the IC in conjunction with practice of the present invention.

The source means 14 further comprises an electrostatic lens 30 for receiving the beam of ions from the source 28 and producing the focused ion beam 16 therefrom with a focused-beam diameter of about one micron or less. (The focused-beam diameter is preferably sized to be less than or equal to a feature size of the IC 100 to be analyzed or controlled.) The source means 14 may further include additional elements such as a shutter or the like for interrupting the beam 16, a beam current monitor, control means for adjusting and maintaining the ion-beam energy, and a current-defining aperture for defining a predetermined ion beam current or current range.

For practice of the present invention, at least one IC 100 is placed on the stage 12 and a predetermined portion of the IC is exposed to the incident focused ion beam 16. The portion of the IC to be irradiated may be positioned to intercept the focused ion beam by moving the ion beam with the beam-directing means 18 and/or by moving the stage (e.g. with a multi-axis linear and/or angular translation stage or the like). In some preferred embodiments of the present invention, the focused ion beam may be electrostatically raster scanned over the predetermined portion of the IC one or more times for locating an element of the IC to be irradiated, with the beam 16 being positioned at the location of the element during or after the raster scan for sufficient time to irradiate the element and thereby provide the ionbeam-generated electrical input signal therein. The exact time to generate the electrical input signal may be, for example, from several seconds to several minutes; and, in general, this time will depend upon a charge dose delivered to one or more predetermined elements in the IC by the focused ion beam, and a susceptibility of the elements to alteration (e. g. a logic state or device parameter alteration) by the ion-beam-generated electrical input signal. For a particular IC and application, the time sufficient for producing the ion-beam-generated electrical input signal may be learned by practice of the present invention.

In FIG. 1, the focused ion beam 16 implants metal ions into the surface of the IC (e.g. to a depth of about 2–3 nanometers) and generates secondary particles 102 which emanate therefrom due to the energetic nature of the incident ion beam. These secondary particles comprise low-energy (a few eV) electrons, ions and neutral particles. The sputter yield of the secondary electrons is generally about an order of magnitude higher than that for the secondary ions (most of which are positively charged) so that the portion of the IC being irradiated by the focused ion beam becomes charged at a positive potential (primarily due to the secondary electrons leaving the surface of the IC). This localized charge generation and accumulation (i.e. the positive potential) comprises the electrical input signal generated by the ion-beam apparatus 10. The surface of the IC being irradiated may be a semiconductor substrate portion of the IC (including one or more transistors formed therein), or a passivation or metal layer formed above the substrate.

To provide access for the focused ion beam 16 to the portion of the IC to be irradiated, it is generally desirable to remove at least a part of any intervening layers of material (e.g. passivation layers) so that the electrical input signal is generated at a predetermined location proximate to or within a predetermined element of the IC (e.g. on the surface of a gate of a transistor, or on the surface of an electrically-conducting material such as a semiconductor or metal conductor connected to a transistor, capacitor, resistor or memory cell). (In some embodiments of the present invention, it may be possible to capacitively couple the ion-beam-generated electrical input signal through an intervening passivation layer or the like, thereby eliminating the need for material removal.)

When required, the material removal may be performed by de-passivation methods (e.g. etching) or the like as known to the art, or simply by increasing the ion-beam current for a predetermined period of time to remove the material by sputtering. The use of ion beam sputtering may be accompanied by the provision of a gaseous etchant species (e.g. $XeF_2$) proximate to the IC for assisting in etching one or more layers thereof (e.g. passivation). This is advantageous for reducing the ion-beam current required for etching and also for providing an etch selectivity so that other layers (e.g. metal layers) within the IC are not substantially etched during the material removal process. Thus, the use of ion-beam sputtering may be provide access to one or more predetermined portions of the IC 100 without otherwise affecting the remainder of the device. In some instances, it may be desirable to redeposit material (e.g. by ion-beam deposition using a gaseous reactant species such as a siloxane (e.g. TEOS or the like) or a volatile organometallic compound provided proximate to the IC) to at least partially fill in the sputtered portions, thereby producing a fully functional or repaired IC after analysis or control thereof.

The ion-beam-generated electrical input signal according to the present invention may be used to alter or control a pre-existing logic state within one or more elements (e.g. memory elements comprising transistors, capacitors or the like) of the IC, or to program the elements in predetermined logic states. The electrical input signal may also be used for biasing, controlling, altering or otherwise affecting a device or circuit parameter within one or more predetermined elements within the predetermined portion of the IC. As an example, a threshold voltage and/or a gate oxide leakage of a transistor in an IC may be altered or controlled by providing the ion-beam-generated signal to a gate thereof for affecting an electrical charge thereon. As another example, an oscillation frequency of a voltage-controlled oscillator within an IC may be controlled by providing the ion-beam-generated electrical input signal to a frequency-determining capacitor for altering or controlling a stored charge thereon.

Positioning of the focused ion beam within a predetermined portion of the IC 100 to be irradiated may be provided by using a computerized mask layout (i.e. a CAD layout within a computer) or the like as a navigation aid for providing positional information to the control unit 24 or other means for controlling the beam-directing means 18 and/or the stage 12. Furthermore, as a check on the positioning of the focused ion beam, the predetermined portion of the IC may be raster scanned with the focused ion beam, and a secondary particle image generated for display or registration with the mask layout prior to irradiating the predetermined portion and generating the electrical input signal to one or more predetermined elements of the IC. (If desired, an electron floodgun may be switched on for sufficient time to neutralize or reduce any ion-beam charge buildup accumulated prior to the ion beam irradiation step for generating the electrical input signal to the IC.)

In FIG. 1, the ion-beam apparatus 10 preferably includes a secondary particle detector 32 located above IC 100 for detecting the secondary particles 102 generated by the incident focused ion beam 16. The secondary particle detector may be, for example, a microchannel plate (MCP) detector (or alternately a channeltron detector) mounted below the source means 14 as shown in FIG. 1 with an aperture 34 provided for transmission of the focused ion beam 16. The MCP detector 32 generally comprises a plurality of hollow lead glass tubes or channels arrayed parallel to the focused ion beam with a bias voltage of several hundred volts provided across the detector (for example, about +400 volts for detecting secondary electrons, and about −1400 volts for detecting secondary ions). An electron shower is generated within each glass channel each time that an incident secondary ion or electron strikes an interior surface of the channel. Thus, the effect of each secondary particle incident on a bottom surface of the MCP detector is amplified to produce a much larger charge at the top surface thereof which may be periodically measured or sampled to provide a detector output signal for indicating the quantity of secondary particles being emitted from the portion of the IC in response to the focused ion beam irradiation. The type of secondary particles (ions or electrons) to be detected may be determined by the polarity of the bias voltage applied to the MCP detector. For detecting an electrical effect in the IC (e.g. a node voltage or logic level) with the secondary particle detector 32, secondary electrons are preferably detected due to the positive surface charging on the IC, and an increased sensitivity for detection of any electric potential within the IC due to a much smaller mass of electrons as compared to ions.

The use of a secondary particle detector 32 is advantageous for providing an image of the portion of the IC being irradiated by the focused ion beam for locating the predetermined portion to be irradiated, or for detecting the ion-beam-generated electrical effect (e.g. an altered logic level or node voltage) in the IC. (Any voltage present within the portion of the IC being irradiated due to surface charging by the incident ion beam and/or electrical stimulus applied to the IC by the electrical connections 22 thereto acts to modulate secondary electron emission from the IC.) The image may be generated and viewed on a display 36 or digitized and stored within a computer by providing detector connections 38 between the secondary particle detector 32 and the control unit 24 (or other detector-control means for providing a bias-voltage to the detector 32 and for receiving a detected signal output therefrom for display and/or digitization), and also by providing beam-directing connections 40 between the beam-directing means 18 and the control unit (or other beam-control means for providing an electrostatic drive voltage to the beam-directing means and for providing a position signal to the display or computer).

For imaging a portion of the IC that is substantially larger than the focused ion beam diameter (typically less than or about a feature size of the IC being analyzed), a raster scan of the focused ion beam over the portion of the IC is preferably used, with the image contrast (i.e. intensity) at each point or pixel in the image being proportional to the number of secondary particles generated at a particular point on the surface of the IC. The image generated from the secondary particle detector 32 consists of a "normal" or topographical image of the IC 100 with further intensity modulation superposed thereon due to any electrical potential present within the imaged portion of the IC (e.g. due to internally-applied voltages and/or due to charge produced by the incident ion beam 16). Thus, according to some preferred embodiments of the present invention, the detection means includes a secondary particle detector for imaging the electrical effect due to the ion-beam-generated electrical input signal provided to one or more elements within the predetermined portion of the IC.

Figure 3:
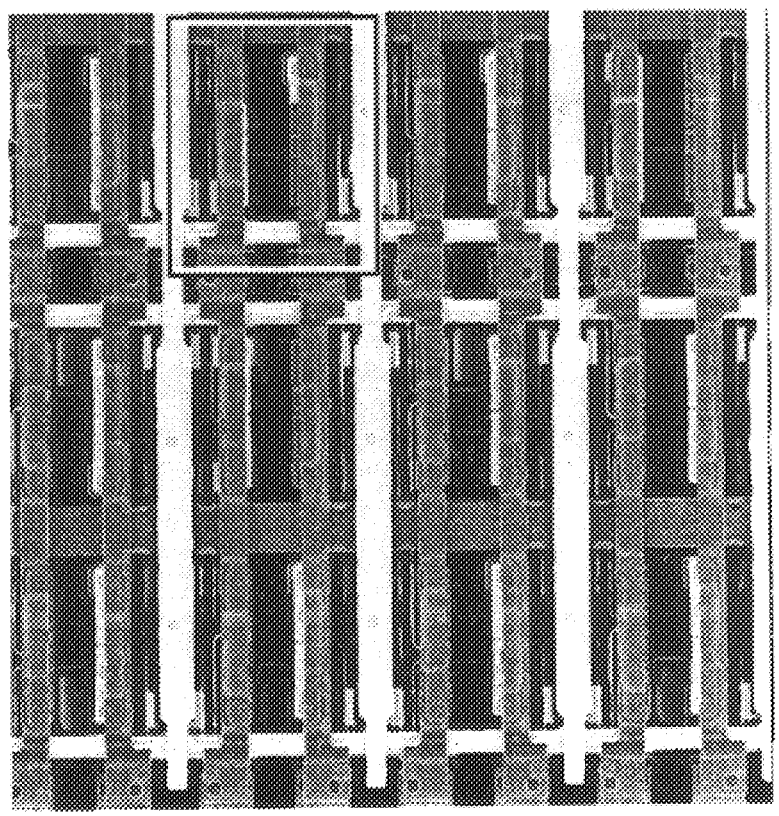
FIG. 3 shows a plurality of unit cells as in FIG. 2b arrayed to form the predetermined portion of the IC, with the logic state of a selected unit cell (indicated by the black and white outline surrounding the cell) being altered from an initial "0" logic state to a final "1" logic state during irradiation and imaging of the predetermined portion of the IC with the ion-beam apparatus and method of the present invention.

In the case of a secondary electron image of the portion of the IC 100 as shown in FIG. 3, low voltage levels of about 1 volt or less (and including a logical "0" state in this example) generally appear as light (i.e. whiter) regions in the image due to detection of the secondary electrons emitted from these light regions; while darkened (i.e. blacker) regions in the image are indicative of higher voltage levels of up to about 5 volts or more (and including a logical "1" state in this example) due to suppressed secondary electron emission from these darkened regions. (Dielectric materials and electrically-floating or open-circuit portions of unbiased conductors may be charged up by the focused ion beam so that they also appear as darkened regions in the secondary electron image.) Simulations of trajectories of secondary electrons emitted from the surface of the IC as a function of voltage levels (i.e. electrical potentials) on the surface of an IC indicate that a majority of the secondary electrons sputtered from an unpassivated metal conductor line maintained at a voltage level of 0 volts are detectable by a secondary electron detector 32 (e.g. a microchannel plate detector); whereas the majority of the secondary electrons sputtered from an adjacent unpassivated metal line maintained at a voltage level of +5 volts are recaptured at the surface of the IC and therefore are not detectable by the secondary electron detector.

In some embodiments of the present invention it may be preferable to further include a source of electrons proximate to the IC 100 for providing electrons to neutralize, at least in part, an ion-beam-generated charge or to remove an ion-beam-generated electrical input signal. This may be preferred, for example, to remove at least a part of an accumulated charge due to imaging of the IC with the focused ion beam 16. Otherwise, the secondary electron image quality may be degraded due to the charging effect of the ion beam; and this may limit the detectability of the electrical effects within the IC to be measured with the apparatus 10. As another example, a first preselected portion of the IC 100 may be programmed or altered for analysis thereof; and then the ion-beam-generated electrical input signal may be partially or substantially erased from this portion of the IC so that another portion of the IC may be analyzed in a similar manner with the focused ion beam 16. As yet another example, a memory cell or logic element of an IC may be programmed in a first logic state by the incident focused ion beam for developmental analysis of the IC, and then reprogrammed in a second logic state by neutralizing a charge provided by the incident beam 16.

In FIG. 1, the source of electrons is preferably an electron floodgun 42 or the like that preferably provides low-energy (>1 keV) electrons 44 to the surface of the IC for neutralizing a positive charge due to the metal ions (e.g. $Ga^+$) which are implanted into the surface of the IC 100 by the focused ion beam 16. (In other embodiments of the present invention, an electron beam having an energy of about 0.3–30 keV or more may be provided for use in neutralizing or reducing the positive charge due to the implanted ions and for additionally imaging the IC to reduce the possibility for any ion-beam damage to the IC during imaging thereof.) The electron floodgun 42 may be used in combination with a mesh screen 46 having a central aperture for passage of the ion beam, with the mesh screen being located between the secondary particle detector 32 and the IC for electrostatically directing the electrons 44 to the surface of the IC.

Use of the electron floodgun 42 is generally to be preferred during secondary ion imaging for reducing any charging and/or electrostatic discharge damage in the IC due to a charge dose provided by the focused ion beam. (The charge dose is determined by a scan rate of the ion beam 16, by a total number of raster scans, and by the ion-beam current.) Operating the ion beam at a low current (of a few pA or less) while flooding the surface of the IC with the electrons 44 is advantageous for reducing the charge dose and thereby permitting a repeated or prolonged raster scanning of a particular portion of the IC.

Alternately, a frame grabber or the like may be used for digitizing and recording a single raster-scanned secondary particle image of the IC for analysis or display. This is advantageous when the IC is to be repaired after analysis, since repeated imaging of the IC with the focused ion beam may produce a permanent physical change in the IC. Furthermore, prolonged metal ion implantation due to continuous imaging (e.g. with repeated raster scanning) may eventually impair the ability to image the IC, leading to a reduced number of secondary electrons reaching the detector (i.e. image fade-out), even after neutralization of the surface of the IC with the electron floodgun. Finally, the use of a frame grabber or the like is especially preferred for secondary electron imaging, since the floodgun is generally not usable during secondary electron imaging due to the large quantity of the electrons 44 which would be detected thereby disrupting or masking the detected signal from secondary electrons emitted from the IC. (The electron floodgun, however, may be used between raster scans for forming secondary electron images, thereby neutralizing at least in part any surface charging in the IC.)

During secondary electron imaging, the mesh screen 46 is generally used with a positive bias voltage of about 70–80 volts or more to assist in accelerating and capturing secondary electrons with the detector 32. When the mesh screen is used for secondary electron imaging at the above bias voltage (and with a detector bias voltage of about +400 volts), logic levels of 0 V and 3.3–5 V are discernible. Smaller voltage differences (down to about 0.5 volts) on unpassivated or depassivated conductors may be discernible by altering the bias voltages from the above values.

The detection means according to other preferred embodiments of the present invention may comprise electrical means connected to the IC by a plurality of electrical connections 22 thereto for measuring the electrical effect due to the ion-beam-generated electrical input signal. Use of the electrical means is advantageous for analyzing functional modifications within the IC during and/or after the ion-beam irradiation. As an example, the electrical means may be used during ion-beam irradiation to determine an ion-beam-generated charge dose (i.e. a deposited or accumulated charge) required to produce a particular logic state or device parameter alteration, or to interactively control (e.g. in combination with a reduced bias voltage to the IC) one or more logic states or device parameters within the IC. As another example, the electrical means may be switched on after ion-beam irradiation of a predetermined portion of the IC 100 to measure an ion-beam-generated electrical effect due to one or more altered logic states or altered device parameters upon power-up or reset of the IC 100. As yet another example, the electrical means may be used to program the IC in a particular logic state prior to the ion-beam irradiation, and to measure an ion-beam-generated electrical effect in the IC thereafter. Furthermore, the electrical means may be used for monitoring other focused-ion-beam process steps conducted on the IC including an evaluation of device parameters (e.g. an interconnection resistance) during ion-beam milling and/or ion-beam deposition processes, and during precise ion-beam cross-sectioning of submicron device structures (e.g. programmed antifuses).

Figure 2A:
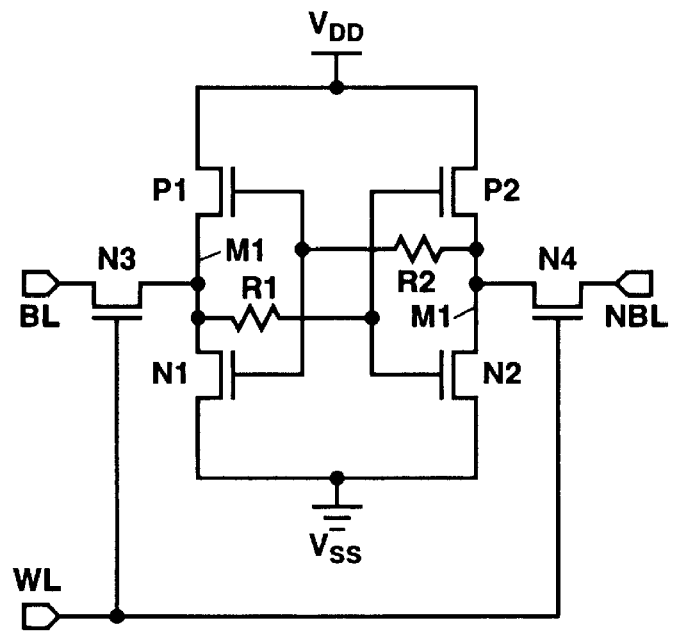
FIGS. 2a and 2b show a circuit diagram and a unit cell, respectively, of an example of an integrated circuit to be analyzed and controlled by the ion-beam apparatus and method of the present invention.
Figure 2B:
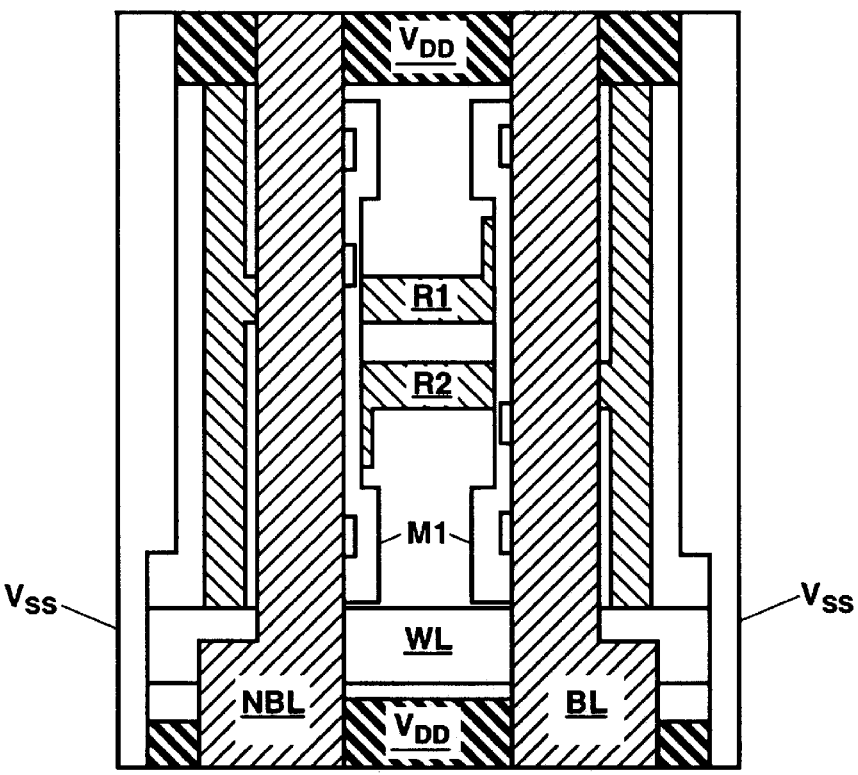

FIGS. 2a and 2b show a circuit diagram and a unit cell, respectively, of an example of an integrated circuit to be analyzed and controlled with the ion-beam apparatus and method of the present invention. Other examples and uses for the ion-beam apparatus and method of the present invention will become evident to those skilled in the art upon practice of the invention.

In FIG. 2a, the circuit diagram represents one of a plurality of complimentary metal-oxide semiconductor (CMOS) static random access memory (SRAM) cells which comprise the predetermined portion of the IC to be analyzed in this example. Each CMOS memory cell (i.e. each unit cell) comprises two cross-coupled inverters and two access transistors. Drain to gate connections between the inverter pairs are provided through feedback resistors (formed in a deposited polysilicon layer); and common drain and source connections to the drain ($V_{DD}$) and source ($V_{SS}$) direct-current (dc) power supply buses are provided by a patterned two-level metallization. In FIG. 2a, drain straps (indicated by M1) in the first-level metallization connect the n- and p-channel transistors in each inverter pair, with the drain strap connected to the bit line (BL) by the access transistor N3 maintained at a voltage level that indicates the logic state of the memory cell.

FIG. 2b shows a physical layout of the memory cell fabricated with a two-level metallization (i.e. two patterned metallization layers) and a 2-pm feature size. The unit cell diagram in FIG. 2b shows the drain straps (M1) and other visible features of the memory cell to aid in interpreting the secondary electron image of the IC in FIG. 3. (The n- and p-channel transistors which are formed in the semiconductor substrate are omitted from FIG. 2b since these elements are not readily visible in FIG. 3 due to overlying layers.)

FIG. 3 shows a secondary electron image of the predetermined portion of the IC (a 16K CMOS SRAM) containing a plurality of memory cells for analysis and control with the ion-beam apparatus 10 in this example. Prior to analysis, a glass passivation layer was removed by etching to permit access of the focused-ion beam 16 to the underlying metallization and polysilicon layers to permit secondary electron imaging of the predetermined portion of the IC; although for other examples, the passivation layer need be removed only at predetermined locations (e.g. the memory cell drain straps) wherein the ion-beam irradiation is to be performed, and this material removal may be performed simply and directly with the ion beam (preferably in combination with a gaseous reactant species such as $XeF_2$) by increasing the ion-beam current to a level suitable for ion milling (or ion assisted etching) of the passivation layer.

For this example, the electrical connections 22 provide the IC with a drain power supply voltage $V_{DD}$=5 volts, and a source power supply voltage $V_{SS}$=0 volts. These power supply voltages are responsible for the darker and lighter appearance of the drain ($V_{DD}$) and source ($V_{SS}$) buses, respectively, in FIG. 3. With power applied to the IC, each memory cell therein initially latches to a logical "0" or a logical "1" state, with each memory state being somewhat randomly determined although detectable in the secondary electron image (and controllable if so desired by a suitable charge deposition provided by the apparatus 10 prior to power-up). In this power-up state or condition shown in the present example, the bit lines (BL) and not-bit lines (NBL) are both maintained at the drain voltage (5 volts) for providing a logical "1" level thereto and the word lines (WL) are maintained at the source voltage (0 volts) for providing a logical "0" level thereto, since the memory cells are neither being read out or written to by the electrical connections 22 to the IC.

In FIG. 3, one of the memory cells is highlighted by a black and white outline box to show the alteration or control of the logic state within this memory cell after sufficient irradiation time with the focused-ion beam. The highlighted memory cell has a layout identical to that shown schematically in FIG. 2b, with the other memory cells in FIG. 3 adjacent to the highlighted cell having cell layouts that are inverted about axes centered along the $V_{SS}$ and/or the $V_{DD}$ buses. The initial logic state of the highlighted cell is a logical "0" state as indicated by the light (i.e. whiter) upper portion of the rightmost drain strap (M1) adjacent to the bit line (BL) wherein irradiation of the cell with a horizontal raster scan of the focused ion beam is commenced. After irradiating the highlighted memory cell in FIG. 3 for a period of time sufficient for switching of the logic state therein, the image contrast of the two M1 drain straps is reversed, indicating that the memory state of the cell has been altered or switched from the initial logical "0" state to a final logical "1" state. The logic states of the remaining memory cells in FIG. 3 are unaffected since these cells are irradiated by the focused ion beam for insufficient time for switching of the logic states. (Generally, a predetermined charge accumulation to be provided for alteration or switching of logic states in selected elements should substantially exceed any ion-beam charge accumulation which might be delivered to other non-selected elements of the IC by imaging of the predetermined portion.)

This example shows the ability of the apparatus of the present invention to analyze and control elements within a predetermined portion of an IC by irradiation with a focused-ion beam. Use of the apparatus and method for altering or programming logic states is useful for failure analysis or developmental analysis of ICs or the like, with the logic state alteration persisting for a prolonged time of up to several hours or days or even longer after removal of the IC from the focused-ion-beam apparatus (depending upon any charge and/or current leakage paths present in the IC), or until a charge neutralization step is provided (e.g. with the electron floodgun 42) for restoring a normal operating condition of the IC or for permitting the analysis and/or control of other portions of the IC by additional focused-ion-beam irradiation steps.

There has thus been shown an ion-beam apparatus and method for analyzing and controlling semiconductor integrated circuits. The apparatus and method provides at least one ion-beam-generated electrical input signal to an IC for analyzing the IC, or for determining a device or circuit parameter therein. The matter set forth in the foregoing description and accompanying drawings is offered by way of illustration only and not as a limitation. Other applications and variations of the ion-beam apparatus and method for analyzing and controlling integrated circuits will become evident to those skilled in the art. The actual scope of the invention is intended to be defined in the following claims when viewed in their proper perspective based on the prior art.

What is claimed is:

1. An ion-beam apparatus for analyzing a semiconductor integrated circuit (IC) comprising:
    (a) a stage for holding the IC;
    (b) source means for producing a focused ion beam; and
    (c) beam-directing means for directing the focused ion beam to irradiate a predetermined portion of a surface of the IC for sufficient time to alter a logic state of a predetermined element of the IC.

2. The ion-beam apparatus in claim 1 further including detection means for detecting an ion-beam-generated electrical effect in the IC due to the altered logic state.

3. The ion-beam apparatus in claim 2 wherein the detection means includes a secondary particle detector for generating a secondary particle image of the predetermined portion of the IC to display the ion-beam-generated electrical effect in the IC.

4. The ion-beam apparatus in claim 3 wherein the secondary particle detector is a microchannel plate (MCP) detector.

5. The ion-beam apparatus in claim 2 wherein the detection means includes electrical means connected to the IC by a plurality of electrical connections thereto for providing electrical stimulus to the IC and for measuring the ion-beam-generated electrical effect in the IC.

6. The ion-beam apparatus in claim 5 wherein the electrical means includes a switch matrix for controlling the electrical connections to the IC.

7. The ion-beam apparatus in claim 6 wherein the switch matrix is computer controlled.

8. The ion-beam apparatus in claim 1 wherein the beam-directing means provides a raster scan of the focused ion beam over the predetermined portion of the IC.

9. The ion-beam apparatus in claim 1 further including a source of electrons proximate to the IC for providing electrons to neutralize, at least in part, an ion-beam-generated charge on the surface of the IC.

10. An ion-beam apparatus for analyzing a semiconductor integrated circuit (IC) comprising:
    (a) a stage for holding the IC;
    (b) source means for producing a focused ion beam; and
    (c) beam-directing means for directing the focused ion beam to irradiate a predetermined portion of a surface of the IC for sufficient time to provide an electrical input signal to a predetermined element in the IC.

11. The ion-beam apparatus in claim 10 further including detection means for detecting an ion-beam-generated electrical effect in the IC circuit due to the electrical input signal.

12. The ion-beam apparatus in claim 11 wherein the ion-beam-generated electrical effect is an altered logic state in the IC.

13. The ion-beam apparatus in claim 11 wherein the ion-beam-generated electrical effect is a device parameter of at least one element in the predetermined portion of the IC that is defined, at least in part, by the focused ion beam irradiation.

14. The ion-beam apparatus in claim 11 wherein the detection means includes a secondary particle detector for generating a secondary particle image of the predetermined portion of the IC to display the ion-beam-generated electrical effect.

15. The ion-beam apparatus in claim 14 wherein the secondary particle detector is a microchannel plate (MCP) detector.

16. The ion-beam apparatus in claim 11 wherein the detection means includes electrical means connected to the IC by a plurality of electrical connections thereto for providing electrical stimulus to the IC and for measuring the ion-beam-generated electrical effect.

17. The ion-beam apparatus in claim 16 wherein the electrical means includes a switch matrix for controlling the electrical connections to the IC.

18. The ion-beam apparatus in claim 17 wherein the switch matrix is computer controlled.

19. The ion-beam apparatus in claim 10 wherein the beam-directing means provides a raster scan of the focused ion beam over the predetermined portion of the IC.

20. The ion-beam apparatus in claim 10 further including a source of electrons proximate to the IC for providing electrons to neutralize, at least in part, an ion-beam-generated charge on the surface of the IC.

21. A method for analyzing a semiconductor integrated circuit (IC) comprising the steps of:
    (a) placing at least one IC on a stage; and
    (b) irradiating a predetermined portion of a surface of the IC with a focused ion beam for sufficient time for generating at least one ion-beam-generated electrical input signal in the IC.

22. The method of claim 21 further including a step for measuring an electrical effect in the IC due to the ion-beam-generated electrical input signal.

23. The method of claim 22 wherein the step of measuring the electrical effect includes using the focused ion beam for generating a secondary particle image of the predetermined portion of the IC.

24. The method of claim 22 further including a step for supplying electrical stimulus to the IC through electrical connections thereto.

25. The method of claim 24 wherein the step for supplying the electrical stimulus to the IC programs at least one element in the IC in a predetermined logic state.

26. The method of claim 24 wherein the step of supplying the electrical stimulus to the IC includes controlling the electrical connections to the IC by a switch matrix.

27. The method of claim 26 further including controlling the switch matrix by a computer.

28. The method of claim 24 wherein the step of measuring the electrical effect includes measuring at least one electrical output signal from the IC.

29. The method of claim 21 wherein the step of irradiating the predetermined portion of the IC with the focused ion beam includes scanning the beam over the predetermined portion of the IC.

30. The method of claim 21 further including a step for providing electrons on the surface of the IC and neutralizing, at least in part, any ion-beam-generated charge thereon.

31. The method of claim 21 further including a step for removing at least in part any passivation layers above the surface of the IC with the focused ion beam prior to the step for irradiating the predetermined portion of the IC.

32. The method of claim 21 wherein the step for irradiating the predetermined portion of the IC switches a logic state therein.

33. The method of claim 21 wherein the step for irradiating the predetermined portion of the IC defines, at least in part, a device parameter within at least one element of the predetermined portion of the IC.

* * * * *